US006934398B1

(12) United States Patent
Chen

(10) Patent No.: US 6,934,398 B1
(45) Date of Patent: Aug. 23, 2005

(54) METHOD FOR SWITCHING AUDIO SIGNALS AND THE DEVICE OF THE SAME

(75) Inventor: Sun-Chung Chen, Hsichih (TW)

(73) Assignee: Aten International Co., Ltd., Taipei (TW)

( * ) Notice: Subject to any disclaimer, the term of this patent is extended or adjusted under 35 U.S.C. 154(b) by 0 days.

(21) Appl. No.: 10/822,921

(22) Filed: Apr. 13, 2004

(30) Foreign Application Priority Data

Feb. 11, 2004 (TW) .................................. 93103241

(51) Int. Cl.[7] ........................... H02B 1/00; H03G 3/00; H04B 1/00; H00B 15/00

(52) U.S. Cl. ..................... 381/123; 381/94.1; 381/119; 381/81; 381/104; 381/86

(58) Field of Search ................................ 381/123, 104, 381/107, 106, 77, 86, 119, 98–99, 94.5, 94.1, 381/81, 56–58, 80; 700/94

(56) References Cited

U.S. PATENT DOCUMENTS

2003/0026440 A1 * 2/2003 Lazzeroni et al. ............ 381/86

* cited by examiner

*Primary Examiner*—Laura A. Grier
(74) *Attorney, Agent, or Firm*—Thomas, Kayden, Horstemeyer & Risley

(57) ABSTRACT

The method and apparatus are provided for several audio signal processing apparatuses to share at least one audio output device. Several audio signals sent from the audio signal processing apparatuses are received. The DC levels of the audio signals are shifted to a predetermined value. One of the adjusted audio signals is then selected for signal-transmitting to the audio output device. Afterwards, the DC level of the selected audio signal is re-adjusted to the predetermined value.

15 Claims, 6 Drawing Sheets

104

METHOD FOR SWITCHING AUDIO SIGNALS AND THE DEVICE OF THE SAME

BACKGROUND OF THE INVENTION

1. Field of Invention

The invention relates to a switching device and, in particular, to a device for switching audio signals and the method thereof.

2. Related Art

With the rapid development in information technology, computers and their peripherals become very popular. Computer users often use the mouse and keyboard to control the computers. Through the monitors or speakers, the computer users can monitor the state of the computers. Sometimes a user may have more than one computer to process different types of things. Traditionally, each computer is equipped with one set of input/output (IO) peripheral devices, including the keyboard, mouse, monitor, and speakers. However, this is a waste of money and space if one has several computers.

On the other hand, large system businesses or enterprise internal networks often involve tens to thousands servers. Each server needs a monitor, a keyboard and a mouse to for management. In practice, one rarely needs to use these IO peripherals of the servers. Most of the time, the servers do not need to be controlled by the manager. In this situation, it is totally unnecessary, costly, and wasting the space to have a set of IO peripheral devices for each server.

Therefore, a switching device that enables one to use one set of IO peripheral devices to manage several computers has been proposed to solve this problem. The use of a switching device does not only save the cost, it also solve the space and compatibility problems.

However, conventional switching devices do not have a good performance in switching audio signals. For example, the DC levels of audio signals output from different sound cards may vary. This may result in sound blast during the switching. Moreover, if the switching device also process other IO peripheral devices that consume high power at the same time, the DC level in the switching device will float as a result of the huge power consumption elsewhere. This will generate the problem of audio interference.

Moreover, conventional switching devices often use mechanical relays to switch. However, the mechanical switching device has a limited lifetime. It is likely to have spark during the switching. Therefore, it may cause damages to the switching device or even hurt the devices inside the computer.

SUMMARY OF THE INVENTION

An objective of the invention is to provide a method for switching audio signals to adjust the DC level of audio signals. Therefore, the DC levels of the audio signals on both ends of the multitasking switch are remained fixed. This avoids sound blasts caused by a level difference when switching the audio signals or an interference problem due to other high power loads.

Another objective of the invention is to provide a device for switching audio signals. It uses a DC level filter circuit and a DC level adjusting circuit along with a chip to switch audio signals. In addition, to avoid sound blasts and interference, the lifetime of the disclosed switching device is longer. It also prevents the production of sparks or burst waves that damages the computer devices.

In accord with the above objectives, the invention provides a method for switching audio signals and the device thereof. An audio signal output device is shared by a plurality of first audio signal processing devices. The disclosed method first receives a plurality of first audio signals sent from the plurality of first audio signal processing devices and adjusts the DC levels of the first audio signals to a first predetermined value. Afterwards, one of the first audio signals whose DC levels have been adjusted is selected. The DC level of the selected first audio signal is adjusted to the first predetermined value.

The disclosed device includes a plurality of first pre-processing devices connecting to the first audio signal processing devices, a first multitasking switch and at least one post-processing device. Each of the first pre-processing devices receives a first audio signal from the connected first audio signal processing device and adjusts its DC level to a first predetermined value. The first multitasking switch receives the first audio signals from the first pre-processing devices and selects one of them for output. The first post-processing device receives the selected first audio signal and adjusts its DC level to the first predetermined value.

According to a preferred embodiment of the invention, each of the first pre-processing devices contains a first DC level filter circuit and a first DC level adjusting circuit. The first DC level filter circuit removes the DC level of the first audio signal. The first DC level adjusting circuit receives the first audio signal with the DC level removed from the first DC level filter circuit and adjusts the DC level of the first audio signal to the first predetermined value.

The first post-processing device contains a second DC level adjusting circuit and a second DC level filter circuit. The second DC level adjusting circuit receives the first audio signal from the first multitasking switch and adjusts the DC level of the first audio signal to the first predetermined value. The second DC level filter circuit receives the DC-level-adjusted first audio signal from the second DC level adjusting circuit and removes the DC level of the first audio signal. The final signal is output to the audio signal output device.

The first DC level filter circuit contains a first capacitor, and the second DC level filter circuit contains a second capacitor. The first DC level adjusting circuit contains a first resistor and a second resistor. One end of the first resistor is in electrical communications with a high level; the other end of the first resistor is in electrical communications with one end of the second resistor; and the other end of the second resistor is in electrical communications with a low level. The second DC level adjusting circuit contains a third resistor and a fourth resistor. One end of the third resistor is in electrical communications with a high level; the other end of the third resistor is in electrical communications with one end of the fourth resistor; and the other end of the fourth resistor is in electrical communications with a low level. The other end of the first resistor further electrically connects to the first DC level filter circuit and the first multitasking switch. The other end of the third resistor also electrically connects to the second DC level filter circuit and the first multitasking switch.

Moreover, in the preferred embodiment of the invention, the first resistor and the third resistor have the same resistance, and the third resistor and the fourth resistor have the same resistance. The first multitasking switch is a multitasking switch chip. The high level is provided by a voltage adjuster. The low level is a ground level. When the first multitasking switch is a positive-voltage multitasking switch chip, the resistance of the first resistor is greater than that of the second resistor and the resistance of the third resistor is greater than that of the fourth resistor. When the first multitasking switch is a positive-negative-voltage multitasking switch chip, the resistance of the first resistor is equal to that of the second resistor and the resistance of the third resistor is equal to that of the fourth resistor.

According to another embodiment of the invention, the disclosed audio signal switching device can enable a plurality of second audio signal processing devices to share at least one audio signal input device. In this case, the audio signal switching device further contains a second pre-processing device, a second multitasking switch, and a plurality of second post-processing devices. The second pre-processing device connects to the audio signal input device to receive a second audio signal from the audio signal input device. It further adjusts the DC level of the second audio signal to a second predetermined value. The second multitasking switch receives the second audio signal from the second pre-processing device. The second multitasking switch selects the second post-processing devices to input the second audio signal. After each of the second post-processing devices receives the second audio signal, the DC level of the second audio signal is adjusted to the second predetermined value.

The disclosed switching device is formed by adding a set of DC level filter circuit and DC level adjusting circuit on both ends of a multitasking switch. After an audio signal enters the switching device, its DC level is adjusted. After the audio signal passes through the multitasking switch, its DC level is adjusted again so that the DC levels of the audio signal on both ends of the multitasking switch are kept fixed. This can avoid the production of sound blasts because of the level difference during audio signal switching or sound interference due to other high-power loads. The invention can use a multitasking switch chip to switch the audio signals. This can elongate the lifetime of the switching device and prevent the production of sparks or burst waves that hurt the devices.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein.

DETAILED DESCRIPTION OF THE PREFERRED EMBODIMENT

Figure 1:
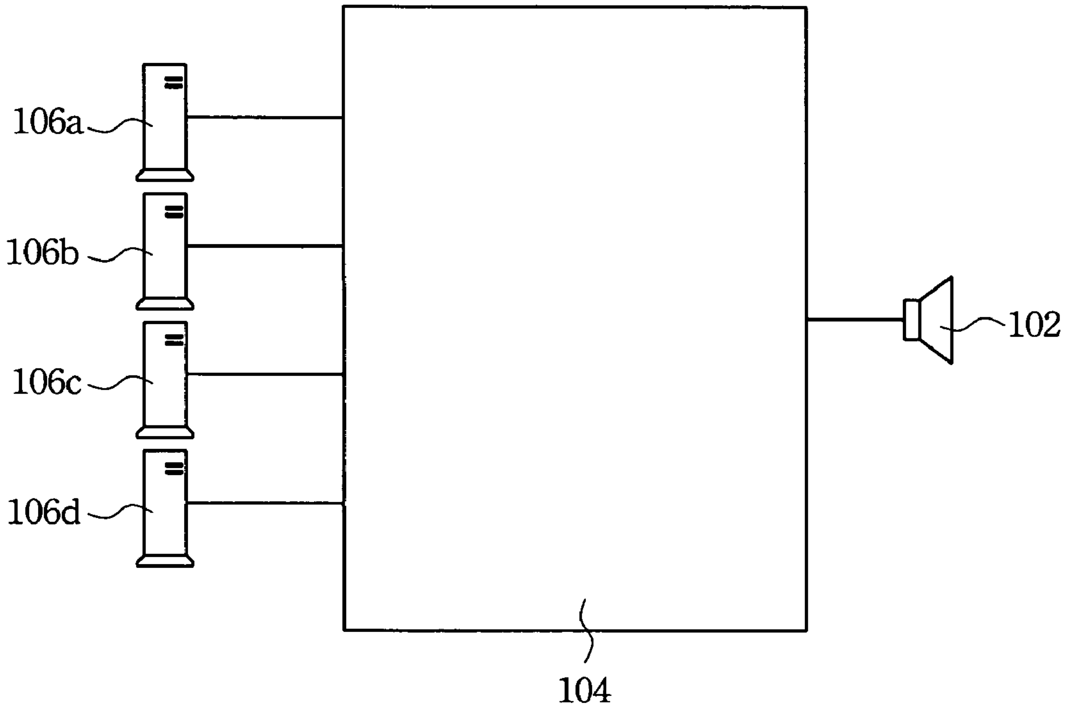
FIG. 1 is a schematic view of a preferred embodiment of the invention in practice.

As shown in FIG. 1, the audio signal processing devices 106*a*, 106*b*, 106*c*, 106*d* share at least one audio signal output device 102 using the disclosed audio signal switching device 104. The audio signal processing devices 106*a*, 106*b*, 106*c*, 106*d* can be sound cards, musical instrument digital interface (MIDI) devices, stereos, sound sources, or televisions. The audio signal output device 102 can be speakers, headphones, microphones, amplifiers, or even the input terminal of other audio signal processing devices.

Figure 2:
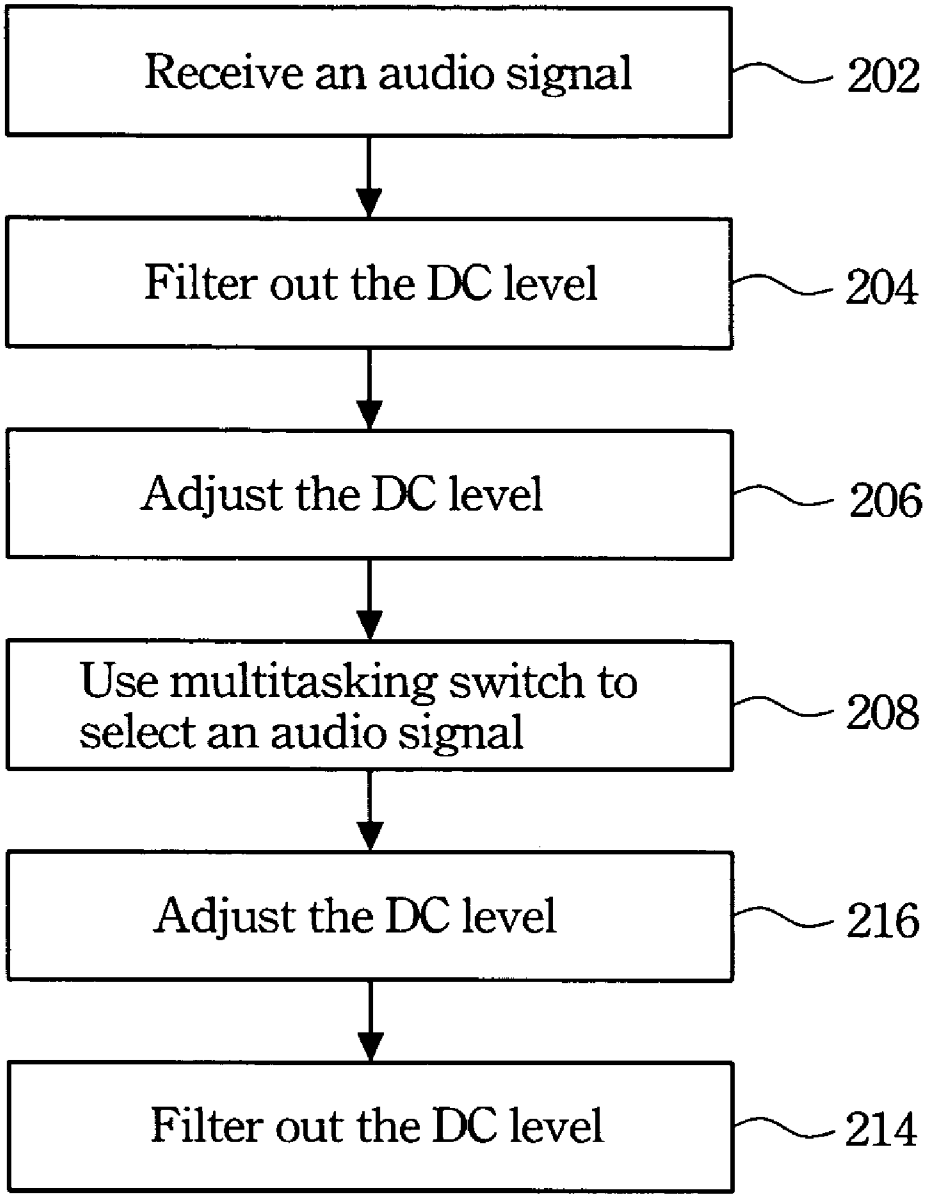
FIG. 2 is a flowchart of a preferred embodiment of the disclosed method.

FIG. 2 shows the flowchart of a preferred embodiment of the disclosed method. The audio signal switching device 104 uses a multitasking switch to select one of the audio signal processing devices 106*a*, 106*b*, 106*c*, 106*d*. The selected audio signal processing device uses the audio signal output device 102 to output audio signals. The disclosed method first receives the audio signals sent from the audio signal processing devices 106*a*, 106*b*, 106*c*, 106*d* (step 202). The DC levels of the audio signals are filtered (step 204). The DC levels of the filtered audio signals are adjusted (step 206). After the audio signals pass through the multitasking switch (step 208), the DC level of the selected audio signal is adjusted again (step 216). Afterwards, the DC level of the re-adjusted audio signal is filtered.

Figure 3:
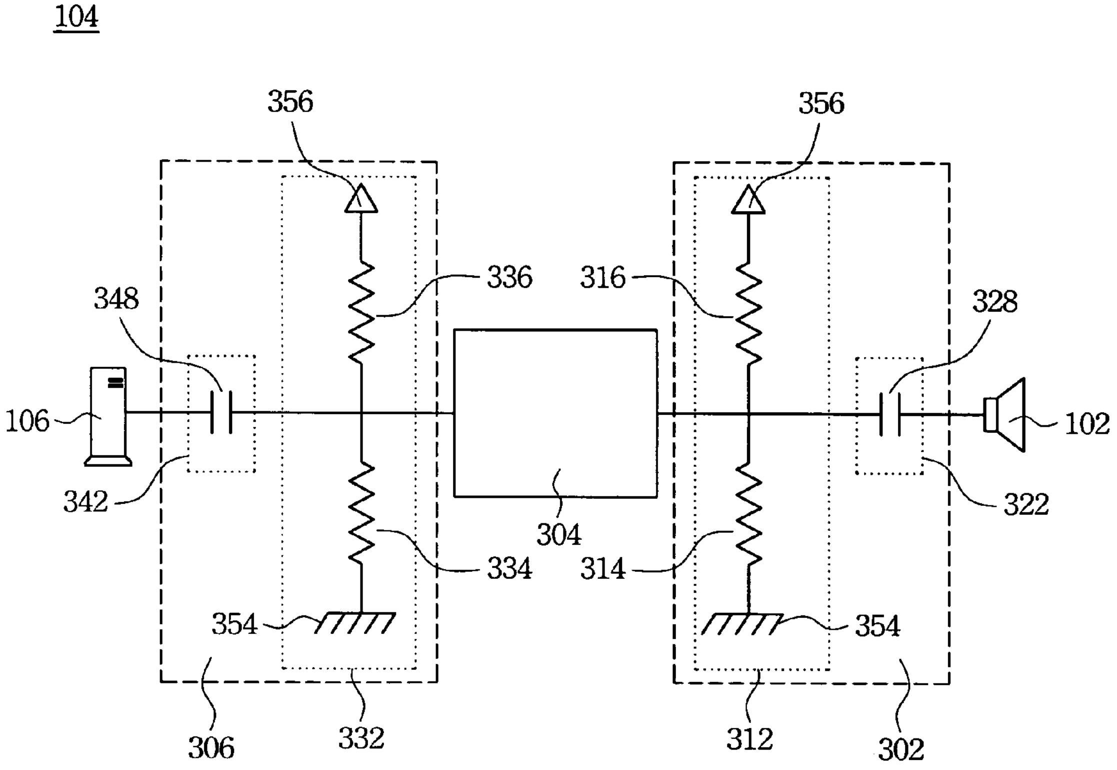
FIG. 3 is a schematic view of the audio signal switching device in FIG. 1.

FIG. 3 is a schematic view of a part of the audio signal switching device in FIG. 1. As described above, the disclosed audio signal switching device connect several audio signal processing devices and at least one audio signal output device. In order to clearly explain the contents of the invention, we only draw one audio signal processing device 106 and one audio signal output device 102 on both ends of the audio signal switching device 104.

The disclosed audio signal switching device 104 contains several pre-processing devices, each of which connects to an audio signal processing device. We use only one set of pre-processing device 306 and audio signal processing device 106 to demonstrate the essence of the invention in FIG. 3. The audio signal switching device 104 also contains at least one post-processing device 302 for connecting to the audio signal output device 102. It uses the multitasking switch 304 to control the switches between the pre-processing device 306 and the post-processing device 302. Therefore, only a particular audio signal processing device 106 can use the audio signal output device 102 to output audio signals.

After the audio signal enters the audio signal switching device 104 from the audio signal processing device 106, the first DC level filter circuit 342 uses the capacitor 348 to remove the DC level of the audio signal. Afterwards, the first DC level adjusting circuit 332 adjusts the DC level of the audio signal. In this embodiment, the first DC level adjusting circuit 332 contains a first resistor 336 and a second resistor 334, using the partial voltage principle of resistors to adjust the DC level of the audio signal. One end of the first resistor 336 is in electrical communications with a high level 356, the other end of the first resistor 336 is in electrical communications with one end of the second resistor 334, and the other end of the second resistor 334 is in electrical communications with a low level 354.

The DC level adjusted audio signal is sent to the post-processing device 302 after pass through the path assigned by the multitasking switch 304. In the post-processing device 302, its DC level is adjusted again by the second DC level adjusting circuit 312. Likewise, the second DC level adjusting circuit 312 contains a third resistor 316 and a fourth resistor 314, using the partial voltage principle of resistors to adjust the DC level of the audio signal. One end of the third resistor 316 is in electrical communications with the high level 356, the other end of the third resistor 316 is in electrical communications with one end of the fourth resistor 314, and the other end of the fourth resistor 314 is in electrical communications with the low level 354. Finally, the DC level re-adjusted audio signal passes through the second DC level filter circuit 322, using the capacitor 328 to filter out the DC level of the audio signal.

The sound blast occurring in the conventional audio signal switching device is simply caused by the fact that the DC level of an audio signal on both ends of the multitasking switch are different when switching among different pre-processing devices and post-processing devices. The invention utilizes the combination of two DC level filter circuit and DC level adjusting circuit 342/332 and 322/312 to fix the DC levels on both ends of the multitasking switch 304. This avoids the production of sound blasts during audio signal switching.

In the preferred embodiment, the first resistor 336 and the third resistor 316 are both in electrical communications with the same high level 356 (3.3V), and the second resistor 334 and the fourth resistor 314 are both in electrical communications with the same low level 354 (ground). Therefore, the resistances of the first resistor 336 and the third resistor 316 are the same, while those of the second resistor 334 and the fourth resistor 314 are the same. This configuration makes the DC levels of the audio signal on both ends of the multitasking switch 304 fixed.

In order to elongate the lifetime of the switching device and to avoid the generation of sparks or burst waves that damage the device, the multitasking switch 304 in the preferred embodiment is a multitasking switch chip. The multitasking switch chip can be a positive-voltage multitasking switch chip driven by a positive voltage or a positive-voltage multitasking switch chip driven by both positive and negative voltages. The positive-voltage multitasking switch chip has a smaller volume. Along with the disclosed audio signal DC level adjusting function, it can be used in a small-size simple audio signal switching device. The positive-negative-voltage multitasking switch chip has a better sound quality and can avoid the crosstalk problem. It is suitable for high-price high-quality audio signal switching devices.

When the multitasking switch 304 is a positive-voltage multitasking switch chip, the resistance of the first resistor 336 is greater than that of the second resistor 334, and the resistance of the third resistor 316 is greater than that of the fourth resistor 314. According to a preferred embodiment of the invention, the resistances of the first resistor 336 and third resistor 316 are 5.6 kΩ and those of the second resistor 334 and the fourth resistor 314 are 10 kΩ. This configuration fixes the DC level of the audio signal on both ends of the multitasking switch 304 to about 2V.

When the multitasking switch 304 is a positive-negative-voltage multitasking switch chip, the resistance of the first resistor 336 is equal to that of the second resistor 334, and the resistance of the third resistor 316 is equal to that of the fourth resistor 314. According to another preferred embodiment of the invention, the resistances of the first resistor 336, the second resistor 334, third resistor 316, and the fourth resistor 314 are all 10 kΩ. This configuration fixes the DC level of the audio signal on both ends of the multitasking switch 304 to about 0V.

Figure 4:
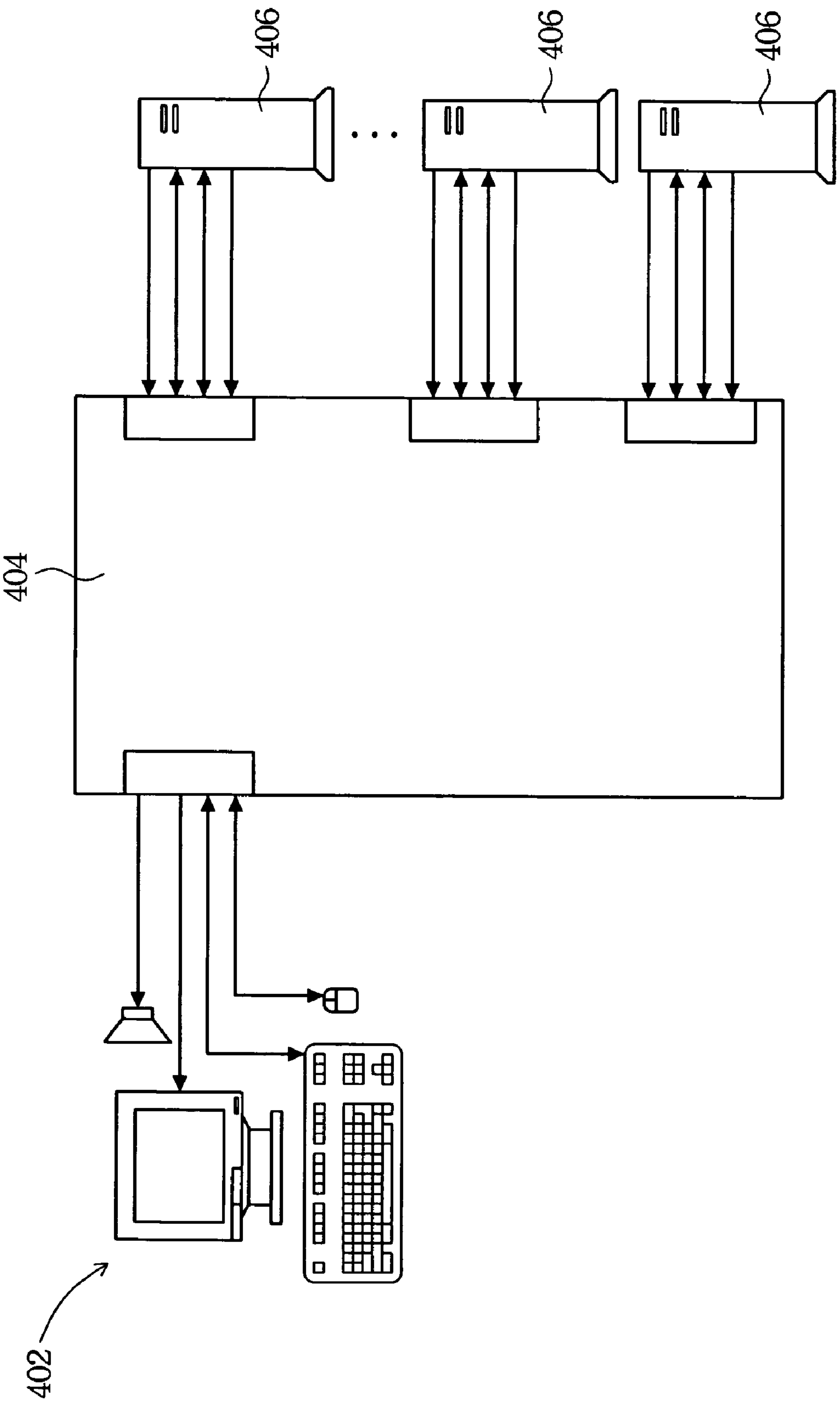
FIG. 4 is a schematic view of a preferred embodiment of the disclosed KVM switch in the audio signal switching device.

In the current preferred embodiment, the disclosed audio signal switching device is combined inside a keyboard-video-mouse (KVM) switch. The KVM switch enables a user to use one set of several sets of IO peripheral devices to manage several computers. FIG. 4 is a schematic view of a preferred embodiment of a KVM switch with the disclosed audio signal switching device. The KVM switch 404 switches among multiple computers 406 and at least one user 402. In this embodiment, to avoid the loads of other high-power devices (e.g. an optical mouse) that cause fluctuations in the level of the KVM switch and therefore the interference sound problem, the invention is powered by a voltage regulator whose low level is the ground level.

Figure 5:
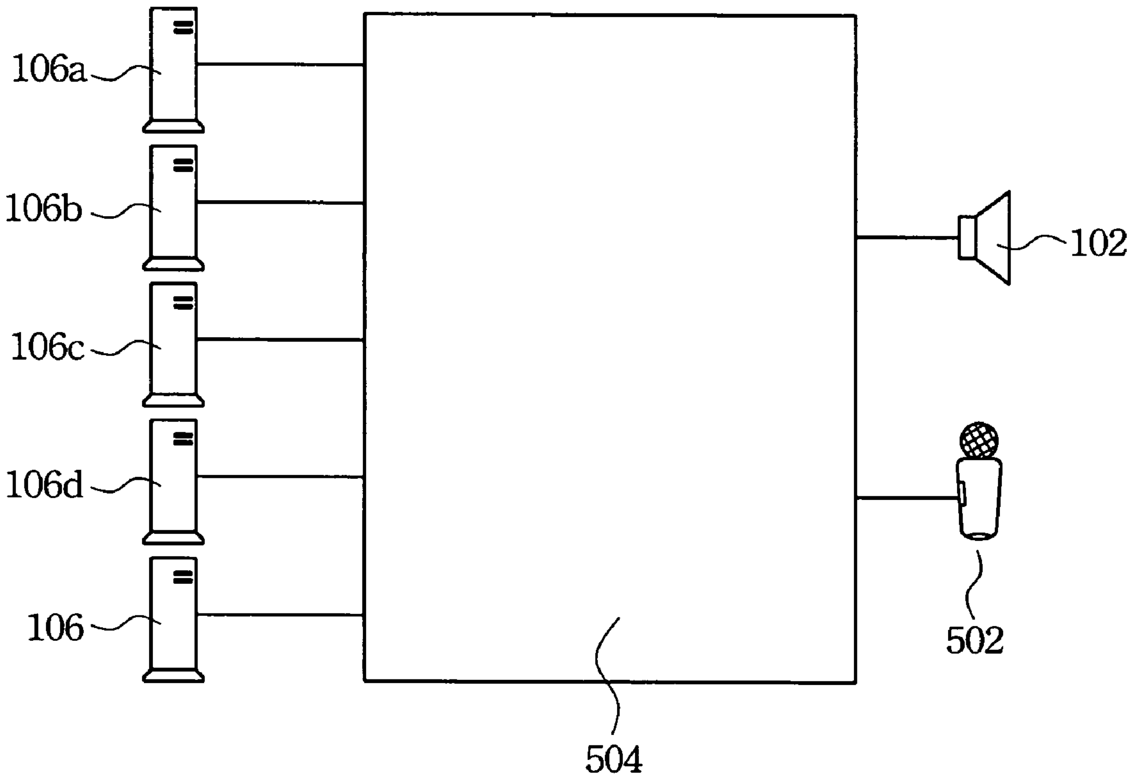
FIG. 5 is a schematic view of another embodiment in practice.

FIG. 5 shows a schematic view of another embodiment in practice. In this embodiment, in addition to using the audio signal switching device 504 to make an audio signal output device 102 selectively receive audio signals sent from the audio signal processing devices 106*a*, 106*b*, 106*c*, 106*d*, the user can further use the same audio signal switching device 504 to control an audio signal input device 502, such as a microphone or a pre-processing device of the audio signal input device. Thus, another audio signal can be input to the audio signal processing devices 106*a*, 106*b*, 106*c*, 106*d* or some other audio signal processing device 106.

Figure 6:
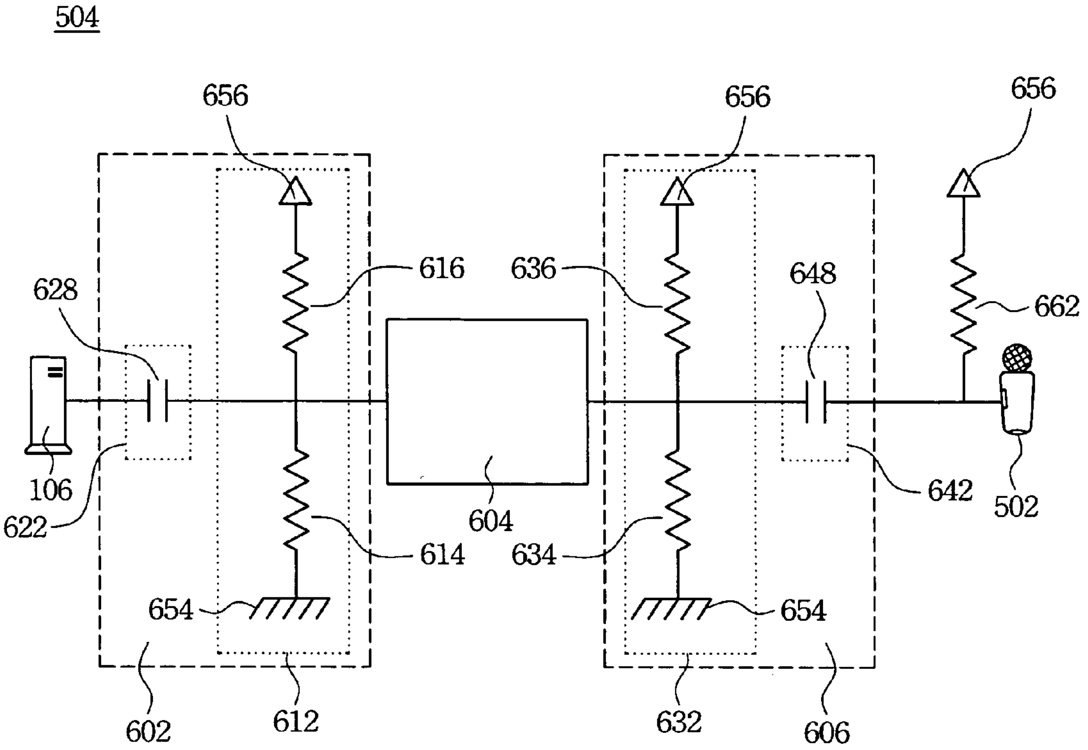
FIG. 6 is a schematic view of a part of the audio signal switching device in FIG. 5.

FIG. 6 shows a part of the audio signal switching device in FIG. 6. In the following, we only explain the part of audio signal input by a user. Other parts are the same as the audio signal switching device in FIG. 3. As described above, the disclosed audio signal switching device connects several audio signal processing devices and at least one audio signal input device. In order to concentrate on the essence of the invention, we only draw an audio signal processing device 106 and an audio signal input device 502 on both ends of the audio signal switching device 504.

The audio signal switching device 504 according to the invention has several post-processing devices, each of which connects to an associated audio signal processing device. We show only one set of post-processing device 602 and audio signal processing device 106 for demonstration purposes. The audio signal switching device 504 also contains at least one pre-processing device 606 for connections with the audio signal input device 502. The multitasking switch 604 is used to control the path switch between the pre-processing device 606 and the post-processing device 602. This enables the audio signal input device 502 to input an audio signal to some audio signal processing device 106.

The audio signal enters the audio signal switching device 504 via the audio signal input device 502, such as a microphone. As the audio signals received by normal microphones are generally very weak, we use a high level 656 with a resistor 662 to amplify them. Afterwards, the first DC level filter circuit 642 uses the capacitor 648 to remove the DC level in the audio signal.

The first DC level adjusting circuit 632 further adjusts the DC level of the audio signal. In the current embodiment, the first DC level adjusting circuit 632 contains a first resistor 636 and a second resistor 634, using the partial voltage principle of resistors to adjust the DC level of the audio signals. One end of the first resistor 636 is in electrical communications with a high level 656, the other end of the first resistor 636 is in electrical communications with one end of the second resistor 634, and the other end of the second resistor 634 is in electrical communications with a low level 654.

After passing the path assigned by the multitasking switch 604, the DC level adjusted audio signal is sent to the post-processing device 602 associated with some audio signal processing device 106, where its DC level is adjusted again by the second DC level adjusting circuit 612. Likewise, the second DC level adjusting circuit 612 contains a third resistor 616 and a fourth resistor 614, using the partial voltage principle of resistors to adjust the DC level of the audio signals. One end of the third resistor 616 is in electrical communications with the high level 656, the other end of the first resistor 636 is in electrical communications with one end of the fourth resistor 614, and the other end of the fourth resistor 614 is in electrical communications with the low level 654. Finally, the DC level re-adjusted audio signal passes through the second DC level filter circuit 622, whose capacitor 628 removes the DC level of the audio signal.

Likewise, when the multitasking switch 604 is a positive-voltage multitasking switch chip, the resistance of the first resistor 636 is greater than that of the second resistor 634, and the resistance of the third resistor 616 is greater than that of the fourth resistor 614. According to a preferred embodiment of the invention, the resistances of the first resistor 636 and the third resistor 616 are both 15 kΩ. The resistances of the second resistor 634 and the fourth resistor 614 are both 27 kΩ.

When the multitasking switch is a positive-negative-voltage multitasking switch chip, the resistance of the first resistor 636 is equal to that of the second resistor 634, and the resistance of the third resistor 616 is equal to that of the fourth resistor 614. According to another preferred embodiment of the invention, the resistances of the first resistor 636, the second resistor 634, third resistor 616, and the fourth resistor 614 are all 10 kΩ.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An audio switching device enabling a plurality of first audio signal processing devices to share at least one audio signal output device, the audio switching device comprising:

a plurality of first pre-processing devices connecting to the plurality of first audio signal processing devices, wherein each of the first pre-processing devices receives a first audio signal from the connected first audio signal processing device and adjusts the DC level of the first audio signal to a first predetermined value;

a first multitasking switch, which receives the first audio signals from the first pre-processing devices and selects one of the first audio signals for output; and a first post-processing device, which receives the selected first audio signal and adjusts the DC level of the selected first audio to the first predetermined value;

wherein each of the first pre-processing devices contains a first DC level filter circuit to filter out the DC level of the first audio signal, and a first DC level adjusting circuit to receive the DC level filtered first audio signal from the first DC level filter circuit and to adjust the DC level of the first audio signal to the first predetermined value; and the first post-processing device contains a second DC level adjusting circuit to receive the selected first audio signal from the first multitasking switch and adjusts the DC level of the selected first audio signal to the first predetermined value, and a second DC level filter circuit to receive the DC level adjusted first audio from the second DC level adjusting circuit and to filter out the DC level of the first audio signal for output to the audio signal output device;

and wherein the first DC level adjusting circuit contains a first resistor and a second resistor, a first end of the first resistor in electrical communications with a high level, a second end of the first resistor in electrical communications with a first end of the second resistor, and a second end of the second resistor in electrical communications with a low level; and the second DC level adjusting circuit contains a third resistor and a fourth resistor, a first end of the third resistor in electrical communications with the high level, a second end of the third resistor in electrical communications with a first end of the fourth resistor, and a second end of the fourth resistor in electrical communications with the low level.

2. The audio signal switching device of claim 1, wherein the first DC level filter circuit contains a first capacitor and the second DC level filter circuit contains a second capacitor.

3. The audio signal switching device of claim 1, wherein the first multitasking switch is a multitasking switch chip.

4. The audio signal switching device of claim 1, wherein the second end of the first resistor is further in electrical communications with the first DC level filter circuit and the first multitasking switch, and the second end of the third resistor is further in electrical communications with the second DC level filter circuit and the first multitasking switch.

5. The audio signal switching device of claim 1, wherein the resistances of the first resistor and the third resistor are the same, and those of the second resistor and the fourth resistor are the same.

6. The audio signal switching device of claim 1, wherein the resistance of the first resistor is greater than that of the second resistor and the resistance of the third resistor is greater than that of the fourth resistor when the first multitasking switch is a positive-voltage multitasking switch chip.

7. The audio signal switching device of claim 1, wherein the resistance of the first resistor is equal to that of the second resistor and the resistance of the third resistor is equal to that of the fourth resistor when the first multitasking switch is a positive-negative-voltage multitasking switch chip.

8. The audio signal switching device of claim 1, wherein the high level is provided by a voltage regulator and the low level is the ground level.

9. An audio signal switching method enabling a plurality of first audio signal processing devices to share one audio signal output device, the method comprising the steps of:

receiving a plurality of first audio signals transmitted from the first audio signal processing devices;

adjusting the DC levels of the first audio signals to a first predetermined value;

selecting one audio signal from the DC level adjusted first audio signals; and adjusting the DC level of the selected first audio signal to the first predetermined value;

filtering out the DC levels of the first audio signals before adjusting the DC level of the first audio signals; and filtering out the DC level of the selected $1^{st}$ audio signal and DC level adjusted first audio signal after the DC level of the selected first audio signal is adjusted; and wherein the DC levels of the DC level filtered first audio signals are adjusted using a first resistor and a second resistor, a first end of the first resistor in electrical communications with a high level, a second end of the first resistor in electrical communications with a first end of the second resistor, and a second end of the second resistor in electrical communications with a low level; and the DC level of the selected first audio signal is adjusted using a third resistor and a fourth resistor, a first end of the third resistor in electrical communications with the high level, a second end of the third resistor in electrical communications with a first end of the fourth resistor, and a second end of the fourth resistor in electrical communications with the low level.

10. The method of claim 9, wherein the DC levels of the first audio signals are filtered by a first capacitor, and the DC level of the selected and DC level adjusted first audio signal is filtered by a second capacitor.

11. The method of claim 9, wherein the selected first audio signal is selected using a multitasking switch chip.

12. The method of claim 9, wherein the resistance of the first resistor is equal to that of the third resistor, and the resistance of the second resistor is equal to that of the fourth resistor.

13. The method of claim 12, wherein the resistance of the first resistor is greater than that of the second resistor and the resistance of the third resistor is greater than that of the fourth resistor when the first multitasking switch is a positive-voltage multitasking switch chip.

14. The method of claim 12, wherein the resistance of the first resistor is equal to that of the second resistor and the resistance of the third resistor is equal to that of the fourth resistor when the first multitasking switch is a positive-negative-voltage multitasking switch chip.

15. The method of claim 12, wherein the high level is provided by a voltage regulator and the low level is the ground level.

* * * * *